United States Patent
Straubinger et al.

(10) Patent No.: US 8,865,324 B2
(45) Date of Patent: Oct. 21, 2014

(54) PRODUCTION METHOD FOR A BULK SIC SINGLE CRYSTAL WITH A LARGE FACET AND MONOCRYSTALLINE SIC SUBSTRATE WITH HOMOGENEOUS RESISTANCE DISTRIBUTION

(75) Inventors: Thomas Straubinger, Erlangen (DE); Michael Vogel, Nuremberg (DE); Andreas Wohlfart, Erlangen (DE)

(73) Assignee: Sicrystal AG, Nuremberg (DE)

( * ) Notice: Subject to any disclaimer, the term of this patent is extended or adjusted under 35 U.S.C. 154(b) by 548 days.

(21) Appl. No.: 12/852,642

(22) Filed: Aug. 9, 2010

(65) Prior Publication Data

US 2011/0300323 A1 Dec. 8, 2011

(30) Foreign Application Priority Data

Jun. 7, 2010 (DE) .......................... 10 2010 029 756

(51) Int. Cl.
*B32B 3/02* (2006.01)
*B32B 17/10* (2006.01)
*B32B 9/00* (2006.01)
*B32B 19/00* (2006.01)
*C30B 23/02* (2006.01)
*C30B 29/36* (2006.01)

(52) U.S. Cl.
CPC ............... *C30B 23/02* (2013.01); *C30B 29/36* (2013.01)
USPC ........... 428/698; 117/951; 428/64.1; 428/409

(58) Field of Classification Search
USPC ............................ 117/951; 428/64.1, 409, 698
See application file for complete search history.

(56) References Cited

U.S. PATENT DOCUMENTS 6,773,505 B2    8/2004  Kuhn et al.

FOREIGN PATENT DOCUMENTS

| DE | 199 31 332 C2 |   | 1/2001 | |
| JP | 2008-001532 | * | 1/2008 | .............. C30B 29/36 |
| JP | 2008-290895 A |   | 12/2008 | |

OTHER PUBLICATIONS

Masakazu et al., JP2008-001532 machine english translation provided by the JPO website, internet retrieval date of Oct. 16, 2012.*
Caldwell et al., "Improved ultraviolet emission from reduced defect gallium nitride homojunctions grown on step free 4H-SiC mesas", vol. 88, 2006, pp. 263509-1 to 263509-3.*

* cited by examiner

*Primary Examiner* — Jonathan Langman
(74) *Attorney, Agent, or Firm* — Laurence A. Greenberg; Werner H. Stemer; Ralph E. Locher

(57) ABSTRACT

A method is used to produce a bulk SiC single crystal. A seed crystal is arranged in a crystal growth region of a growing crucible. An SiC growth gas phase is produced in the crystal growth region. The bulk SiC single crystal having a central longitudinal mid-axis grows by deposition from the SiC growth gas phase, the deposition taking place on a growth interface of the growing bulk SiC single crystal. The SiC growth gas phase is at least partially fed from an SiC source material and contains at least one dopant from the group of nitrogen, aluminum, vanadium and boron. At least in a central main growth region of the growth interface arranged about the longitudinal mid-axis, a lateral temperature gradient of at most 2 K/cm measured perpendicular to the longitudinal mid-axis is adjusted and maintained in this range. The bulk SiC single crystal has a large facet region.

7 Claims, 5 Drawing Sheets

PRODUCTION METHOD FOR A BULK SIC SINGLE CRYSTAL WITH A LARGE FACET AND MONOCRYSTALLINE SIC SUBSTRATE WITH HOMOGENEOUS RESISTANCE DISTRIBUTION

This application claims the priority, under 35 U.S.C. §119, of German application DE 10 2010 029 756.9, filed Jun. 7, 2010; the prior application is here-with incorporated by reference in its entirety.

BACKGROUND OF THE INVENTION

Field of the Invention

The invention relates to a method for producing a bulk SiC single crystal and a monocrystalline silicon carbide substrate.

The semiconductor material silicon carbide (SiC) is used because of its outstanding physical, chemical, electrical and optical properties, inter alia also as the starting material for power electronics semiconductor components, for high-frequency components and for special light-emitting semiconductor components. SiC substrates (e.g. SiC wafers) with as large as possible a substrate diameter, quality that is as high as possible and also a specific electrical resistance which is as uniform as possible are required for these components.

The basis for the SiC substrates are high-grade bulk SiC single crystals, which are generally produced by physical gas phase deposition, in particular by a sublimation method described, for example, in U.S. Pat. No. 6,773,505 B2 and in German patent DE 199 31 332 C2. The disc-shaped monocrystalline SiC substrates are cut out from these bulk SiC single crystals and are then provided in the course of the component production with at least one epitaxial layer also consisting, in particular, of SiC. The quality and reliability of the components also depends inter alia on how homogeneously distributed the local electrical resistance adjusted by adding the dopant during the sublimation growth is. Lateral fluctuations of the dopant concentration in the SiC substrate may lead to non-uniform component properties and even total component failures depending on at which point of the SiC substrate the relevant component is placed. As the SiC substrates are included in the active part of the components, for example because of a rear contacting, defects present in the SiC substrate and/or inhomogeneities, such as doping inhomogeneities, in other words fluctuations of the resistance distribution, influence the properties of the components. Their quality therefore substantially depends on that of the grown bulk SiC single crystal and the SiC substrates obtained therefrom.

During a conventional sublimation growth, different part regions are formed on the growth interface of the growing bulk SiC single crystal. A substantially flat and smooth surface structure (surface morphology) with a very large ratio of the stage depth (or width) to the stage height of the crystal growth stages is present in a central region or at least one close to the center. This facet region is surrounded by a transition region, adjoined by an edge region with a curved and rough surface structure with an approximately balanced ratio of stage depth to stage height of the crystal growth stages. The part regions mentioned also sometimes differ considerably with respect to their respective dopant concentration and therefore with respect to their local electrical resistances. As the edge region includes the largest fraction of the growth interface, the growth conditions are selected such that the edge region has the desired dopant concentration. This results in the fact that the facet region is too highly doped and components processed there may be of low quality or, in the worst case, may even be unusable. The effect of the facet formation and the unusable nature of the facet region for component production are also described, for example, in the abstract of Japanese patent application JP 2008 290 895 A.

SUMMARY OF THE INVENTION

It is accordingly an object of the invention to provide a production method for a bulk SiC single crystal with a large facet and a monocrystalline SiC substrate with homogeneous resistance distribution which overcome the above-mentioned disadvantages of the prior art methods and devices of this general type, which has improved suitability for component production.

In a method for producing a bulk SiC single crystal, a seed crystal is arranged on a front end crucible wall in a crystal growth region of a growing crucible, and an SiC growth gas phase is produced in the crystal growth region. The bulk SiC single crystal having a central longitudinal mid-axis grows by deposition from the SiC growth gas phase, the deposition taking place on a growth interface of the growing bulk SiC single crystal. The SiC growth gas phase is fed at least partially from an SiC source material, which is located in a supply region of the growing crucible, and contains at least one dopant from the group of nitrogen, aluminum, vanadium and boron. At least in a central main growth region of the growth interface arranged about the longitudinal mid-axis, a lateral temperature gradient of at most 2 K/cm measured perpendicular to the longitudinal mid-axis is adjusted and is maintained in this value range during the entire production period, is given to achieve the object relating to the method.

According to the invention, the previous unfavorable triple division of the growth interface into a facet region, a transition region and an edge region, leading to an inhomogeneous lateral resistance distribution, is substantially avoided. With the sublimation growth method according to the invention, a bulk SiC single crystal with a deliberately very large facet region is instead produced. The central facet region forms the largest part, in particular at least 90% of the respective growth interface. This applies, in particular, to the entire period of the bulk SiC single crystal production. Preferably, a facet region is produced which is so large that the remaining region of the respective growth interface surrounding it falls completely in a zone of the edge exclusion, which is not used in any case for the production of components, as the process conditions required for component production cannot be adjusted with adequate precision at the edge. With a diameter of the bulk SiC single crystal of about 100 mm, the edge exclusion extends, for example, about 3 mm from the outer peripheral edge inwardly in the radial direction. It is to be noted here that the edge exclusion region is also present in the previous bulk SiC single crystals with the triple division into the facet region, the transition region and the edge region. It surrounds the edge region.

In the method according to the invention, the dopant addition to the SiC growth gas phase may be adjusted, in particular, during the growth, in contrast to the previous practice, in such a way that the desired dopant concentration and therefore the desired specific electrical resistance is produced in the facet region of the growing bulk SiC single crystal. The previous inefficient practice of recessing the (previously too highly doped) facet region for the production of high-grade components, and leaving expensive substrate surface unused, is therefore superfluous.

Because of the enlargement according to the invention of the facet region, another cause for lower-grade SiC substrates and components is advantageously also eliminated. Outside the facet region, a higher defect density may occur, namely caused by the rougher surface structure provided there, which can also have a negative effect on the component properties and yield. This cause of faults no longer plays a part if—as preferably provided in the scope of the invention—components are exclusively processed in the (correspondingly enlarged) facet region.

In the scope of the invention, it was also recognized that the advantageous enlargement of the facet region—preferably into the edge exclusion region—can be achieved by an unusually small lateral temperature difference adjusted during the entire bulk SiC single crystal production between the center of the growing bulk SiC single crystal determined by the longitudinal mid-axis, and the crystal edge. Thus, a lateral temperature gradient of at most 2 K/cm measured perpendicular to the longitudinal mid-axis is adjusted at least in a central main growth region of the respective growth interface arranged about the longitudinal mid-axis. It is thus achieved that the curvature of the growth interface is substantially reduced to an ideally level growth interface. The curvature of the growth interface influences the size of the facet region. In order to achieve a facet region which is as large as possible, it is favorable to adjust a curvature which is as small as possible for the growth interface. The optionally remaining small residual curvature may change locally. It may be smallest in the center about the longitudinal mid-axis and increase toward the outer peripheral edge of the growth interface. In particular, any (optionally changing) residual curvature on the growth interface is adjusted as a whole such that an axial height difference measured in the direction of the longitudinal mid-axis between the point of the furthest axial growth progress on the growth interface and the peripheral edge of the growth interface is at most 2 mm. In this case, the point of the furthest axial growth progress may be located on the central longitudinal mid-axis. However, this is not imperative. The curvature of the growth interface can be at least largely influenced by the lateral temperature field on the growth interface. In the central region of the growth interface, its curvature is substantially identical to the curvature of the isotherm lines. Consequently, the very low lateral temperature gradient provided according to the invention in the central main growth region leads to the intended reduction in the curvature of the growth interface or enlargement of the facet region.

Overall, with the growth method according to the invention, bulk SiC single crystals can be produced which, because of the large facet region, have a substantially homogeneous lateral distribution of the local electrical resistance. Strong resistance fluctuations, as in conventionally produced bulk SiC single crystals, no longer occur in a bulk SiC single crystal produced according to the invention. Bulk SiC single crystals produced according to the invention are thus distinguished by a higher quality and can be more efficiently used further, in particular for producing semiconductor components.

The preferred configuration wherein the lateral temperature gradient is adjusted to at most 1 K/cm, is distinguished by a particularly level temperature course in the lateral direction, so the curvature of the growth interface can be kept extremely low and, as a consequence thereof, the facet region can be very highly enlarged.

According to a further preferred configuration, a crucible material is used for the growing crucible, the growing crucible is surrounded by a thermal insulation which, in the region about the longitudinal mid-axis adjacent to the front end crucible wall, has a central cooling opening, and a central, in particular round, thermal insulation insert made of an insulation material with a thermal conductivity of at most 50% of that of the crucible material is arranged on the side of the front end crucible wall remote from the seed crystal on or in the front end crucible wall in the region of the central cooling opening. Thus, the influence of the cooling opening provided in the thermal insulation on the lateral temperature field is compensated. The cooling opening is used to adjust the axial, i.e. oriented in the direction of the longitudinal mid-axis, temperature gradient required for the material transport from the SiC source material to the growth interface. On the other hand, the cooling opening in the lateral direction, i.e. perpendicular to the longitudinal mid-axis, brings about a configuration of a convex temperature course with a temperature minimum in the center, whereby an above average growth would occur there. In order to compensate this and to arrive at the desired lateral temperature course which is as level as possible, the central heat insulation insert is provided. Because of its lower heat conductivity, compared with the crucible material, less heat is dissipated to the outside in the center, so the temperature there is maintained at a higher level and, overall, a substantially level lateral temperature course is achieved.

According to a further preferred configuration, a lateral dimension measured perpendicular to the central longitudinal mid-axis is provided for the central thermal insulation insert and differs by at most 50% from the lateral dimension of the central cooling opening. The central thermal insulation insert, compared with the cooling opening, has a size, in which the intended thermal insulating effect is particularly well ensured.

According to a further preferred configuration, the central thermal insulation insert in the direction of the central longitudinal mid-axis is arranged at most 5 mm away from the seed crystal. The central thermal insulation insert in the axial direction is located very close to the growth interface, so that a very intensive influencing is also provided on the lateral temperature course forming there.

According to a further preferred configuration, the central main growth region, in which the lateral temperature gradient is adjusted to at most 2 K/cm, is at least a ⅔ fraction of the total growth interface, and a lateral temperature gradient of more than 2 K/cm, preferably of at least 10 K/cm, is adjusted in an edge growth region, which surrounds the central main growth region and is at most a ⅓ fraction of the total growth interface. Thus, a very small lateral temperature gradient is only adjusted in the central main growth region, whereas in the edge growth region, a higher lateral temperature gradient is worked with than in the main growth region, the area ratio between the main growth region and the edge growth region being at least 2 to 1. The SiC growth gas phase may have a carbon excess in the edge growth region, so an accelerated crystal growth takes place there and the growth interface, in particular with regard to its curvature, sometimes differs considerably from the lateral isotherm lines. In order to counteract an accelerated growth in the edge growth region, a high lateral temperature gradient of more than 2 K/cm, preferably of at least 10 K/cm, and in particular, also a higher temperature, are predetermined there. The additional carbon present in the edge growth region comes in particular from the wall of the growing crucible, which generally consists of a carbon-containing material, such as, for example, a graphite material.

According to a further preferred configuration, a crucible material is used for the growing crucible, and a peripheral, in particular annular, thermal insulation insert made of an insulation material with a heat conductivity of at most 50% of that of the crucible material is arranged on the side of the front end crucible wall remote from the seed crystal on or in the front end crucible wall in the edge region of the front end crucible wall. The peripheral, in particular annular thermal insulation insert, because of its lower heat conductivity compared with the crucible material, effects that less heat is dissipated to the outside in the edge region of the front end crucible wall. As a result, the temperature there and also in the edge growth region is kept at a higher level, so the desired higher lateral temperature gradient is reached in the edge growth region.

According to a further preferred configuration, the peripheral thermal insulation insert arranged concentrically with the longitudinal mid-axis is annular and, with its internal and its external diameter, is in each case arranged spaced apart by at most 10 mm from a side edge of the growing bulk SiC single crystal projected into the plane of the peripheral thermal insulation insert. The peripheral thermal insulation insert covers the side edge of the growing bulk SiC single crystal well, so the intended thermal insulating effect is particularly well ensured in this region.

According to a further preferred configuration, the peripheral thermal insulation insert in the direction of the central longitudinal mid-axis is arranged at most 5 mm away from the seed crystal. The peripheral thermal insulation insert in the axial direction is located very close to the growth interface, so a very intensive influencing of the lateral temperature course forming there is also provided.

According to a further preferred configuration, the lateral temperature gradient at the total growth interface is adjusted to at most 2 K/cm, and a carbon-free crucible material, in particular made of tantalum, is used for the growing crucible at least at a crucible inner side adjoining the crystal growth region. The very small lateral temperature gradient of 2 K/cm is provided at most everywhere on the growth interface. Despite this, no accelerated crystal growth occurs in the edge growth region, as no carbon excess is adjusted there because of the carbon-free crucible material used in this alternative.

According to a further preferred configuration, at the growth interface, an axial temperature gradient measured in the direction of the longitudinal mid-axis of at least 5 K/cm in the direction of the SiC source material, and in particular of at least 10 K/cm, is adjusted. Thus, a relatively high axial temperature gradient of more than 5 K/cm is used. This promotes the facetted growth. The high axial temperature gradient may be selected, in particular, also because of the simultaneously provided relatively small lateral temperature gradient. Otherwise, the susceptibility to cracks of the growing bulk SiC single crystal would rise too sharply. Thus, above all, the configuration of the desired large facet region is also, however, favored.

According to a further preferred configuration, a heating device provided to heat the growing crucible is displaced during the course of the production of the bulk SiC single crystal and, in particular, adapted to the growth progress of the growing bulk SiC single crystal, in particular in the direction of the SiC source material and preferably by the same length, by which the bulk SiC single crystal grows, preferably by 20 mm. In this way it is achieved in a particularly effective manner that the growth interface over the entire period of the bulk SiC single crystal production, has a substantially uniform shape, in particular is as level as possible. The growing bulk SiC single crystal influences the temperature conditions within the crystal growth region. It is therefore favorable, in order to always achieve a temperature field which remains the same as far as possible and therefore growth conditions which remain the same as far as possible at the respective growth interface, to adapt the heating of the growing crucible to the growth progress.

To achieve the object relating to the monocrystalline SiC substrate, a monocrystalline SiC substrate with a main substrate surface and a substrate thickness and with a mean specific electrical resistance, which is determined based on a main substrate surface region, which is at least 90% in size of the main substrate surface, and on the substrate thickness, wherein it applies to the main substrate surface region that a local specific electrical resistance determined for any part surface which is 4 mm$^2$ in size, in particular square, of the main substrate surface region and based on the substrate thickness differs by at most 1 mΩcm from the mean specific electrical resistance is disclosed. The monocrystalline SiC substrate according to the invention is one with a main substrate surface and a substrate thickness as well as with a mean specific resistance, which is determined based on a main substrate surface region, which is at least 90% in size, of the main substrate surface, and on the substrate thickness, wherein it applies to the main substrate surface region that a local specific electrical resistance determined for any partial surface, which is 4 mm$^2$ in size, in particular square, of the main substrate surface region and in relation to the substrate thickness, differs by at most 1 mΩcm from the mean specific electrical resistance.

In particular, the SiC substrate may have a mean specific resistance value of at most 20 mΩcm, for example 15 mΩcm or 16 mΩcm. For this purpose, the SiC substrate is preferably doped with at least one dopant, the at least one dopant preferably being an element from the group of nitrogen, aluminum, vanadium or boron.

The SiC substrate according to the invention in the main substrate surface region is distinguished, overall, by a particularly homogeneous distribution of the local specific electrical resistance. It is accordingly excellently suitable for the efficient production of preferably high-grade components with a low reject rate. In contrast, in component production using previous SiC substrates, because of the inhomogeneously distributed electrical resistance in previous SiC substrates, a lower yield and/or a higher reject rate result. Moreover, the SiC substrate according to the invention, because of the particularly large facet region, which is provided during the bulk SiC single crystal production and preferably extends over the entire main substrate surface region of the SiC substrate produced from the bulk SiC single crystal, has a very low defect density. The large facet region can also be recognized on the SiC substrate. Thus, the facet region, with an optical transillumination of the SiC substrate relative to the edge region, is distinguished by a darker (color) impression. Moreover, the jump of the specific electrical resistance at the transition from the facet region to the edge region can be measured. Furthermore, a stage growth typical of the facet can be recognized and also recorded at the transition from the facet region to the edge region. In any case, the SiC substrate according to the invention can be used with particular advantage, for example as a substrate for producing semiconductor components.

Monocrystalline SiC substrates with such uniformly distributed and, in particular, low electrical resistance did not exist up to now. They can firstly be produced from bulk SiC single crystals, which have been produced by the method according to the invention described above or its configurations, for example by successive and disc-wise cutting or sawing out from bulk SiC single crystals of this type. The main substrate surface of an SiC substrate of this type is in this case in particular oriented substantially perpendicular to the growth direction of the bulk SiC single crystal.

The SiC substrate according to the invention satisfies the industrial requirements with regard to use for producing semiconductor components. A substrate thickness measured perpendicular to the main substrate surface of an SiC substrate of this type is in particular within the range of between about 100 μm and about 1000 μm and preferably in the range of between about 200 μm and about 500 μm, the substrate thickness having a global thickness fluctuation, viewed over the complete main substrate surface, of preferably at most 20 μm. Furthermore, at least one of the two opposing main substrate surfaces has a surface roughness of preferably at most 3 nm. The SiC substrate has a certain mechanical stability and, is in particular, self-supporting. It preferably has a substantially round disc shape, i.e. the main substrate surface is practically round. Optionally, because of at least one distinguishing marking provided at the peripheral edge, a slight deviation from the precisely circular geometry may be present.

According to a preferred configuration, the main substrate surface contains an edge exclusion region, which is at least 10% in size, which surrounds the main substrate surface region, in particular symmetrically or concentrically. Thus, the main substrate surface region with the particularly homogeneous resistance distribution covers the entire useful face of the SiC substrate used to produce components. The edge exclusion region is not used in any case in the component production. For a good surface utilization during the component production it is favorable if the edge exclusion region in particular completely surrounds the main substrate surface region, and the edge exclusion region, the main substrate surface region and the edge exclusion region are arranged, in particular, symmetrically, preferably concentrically with respect to one another. In the edge exclusion region, the SiC substrate may, in particular, also have a higher mean specific resistance value, which may preferably be more than 20 mΩcm, for example 25 mΩcm.

According to further preferred configurations, the main substrate surface has a particularly large substrate diameter, which may, in particular, adopt values of at least 76.2 mm, 100 mm, 150 mm, 200 mm and 250 mm. The larger the substrate diameter, the more efficiently the monocrystalline SiC substrate can be used further, for example for producing semiconductor components. The production costs for the semiconductor components therefore drop. An SiC substrate with a diameter which is so large may advantageously also be used to produce relatively large semiconductor components, which, for example, have a base area of about 1 cm$^2$. With the increasing substrate diameter, the main substrate surface region making up more than 90% of the respective main substrate surface with particularly homogeneous resistance distribution also becomes larger. The main substrate surface region of the SiC substrate substantially corresponds to the particularly large facet region provided during the bulk SiC single crystal production. Viewed absolutely, a larger and larger facet region thus has to be adjusted when growing bulk SiC single crystals with a larger crystal diameter (e.g. substrate diameter of the SiC substrate produced from the bulk SiC single crystal). As the absolute temperature difference should always be approximately the same, viewed over the entire facet region, independently of the crystal diameter of the bulk SiC single crystal, it is advantageous, with the increasing crystal diameter, to adjust a correspondingly lower lateral temperature gradient. A very small lateral temperature gradient also allows the adjustment of an axial temperature gradient which is adequate for the material transport in the case of larger substrate or crystal diameters, so the tendency occurring otherwise specifically in larger substrate or crystal diameters to form mechanical stresses and to form cracks is reduced. To this extent, it is thus particularly favorable specifically in large SiC substrates, which moreover also have resistance distributions which are as homogeneous as possible, if, during the crystal growth process, the measures described above for adjusting a temperature field favoring the formation of a large facet region are carried out.

Other features which are considered as characteristic for the invention are set forth in the appended claims.

Although the invention is illustrated and described herein as embodied in a production method for a bulk SiC single crystal with a large facet and a monocrystalline SiC substrate with homogeneous resistance distribution, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
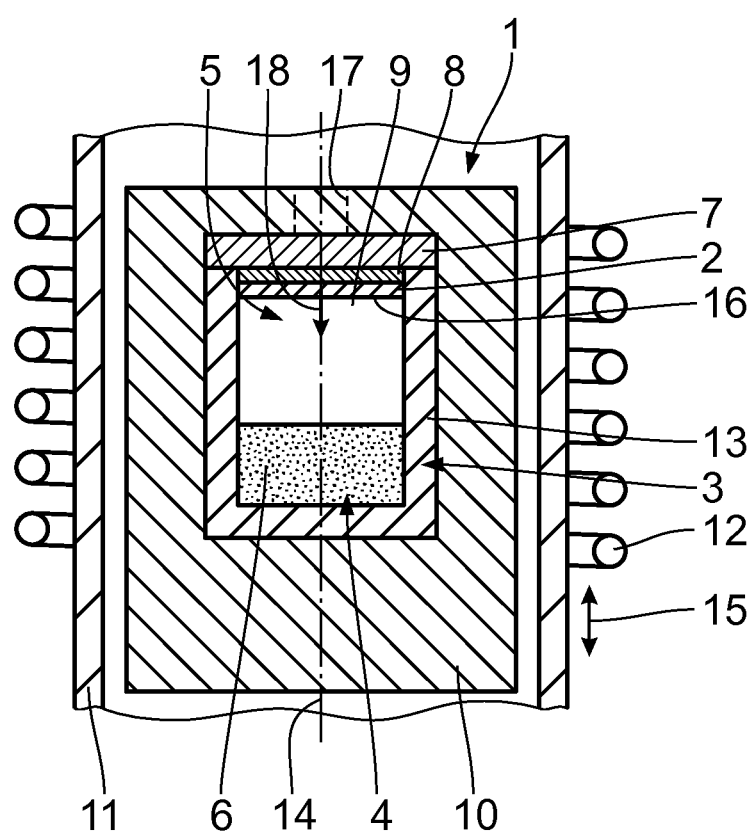
FIG. 1 is a diagrammatic, sectional view of an embodiment of a growth arrangement for producing a bulk SiC single crystal by sublimation growth according to the invention.

Mutually corresponding parts are provided in FIGS. 1 to 8 with the same reference numerals. Details of the embodiments described in more detail below may represent an invention taken on their own or be part of a subject of the invention.

Referring now to the figures of the drawing in detail and first, particularly, to FIG. 1 thereof, there is shown an embodiment of a growth arrangement 1 for producing a bulk SiC single crystal 2 by sublimation growth. The growth arrangement 1 contains a growing crucible 3, which contains an SiC supply region 4 and a crystal growth region 5. Powdery SiC source material 6, which is poured as a pre-finished starting material before the beginning of the growth process into the SiC supply region 4 of the growing crucible 3, for example, is located in the SiC supply region 4.

A seed crystal 8 is provided on an inner wall opposing the SiC supply region 4, of the growing crucible 3, namely on its crucible lid 7, in the crystal growth region 5. The bulk SiC single crystal 2 to be grown grows on the seed crystal 8 by deposition from an SiC growth gas phase 9 forming in the crystal growth region 5. The growing bulk SiC single crystal 2 and the seed crystal 8 have approximately the same diameter. If at all, a deviation of at most 10% is produced, by which a seed diameter of the seed crystal 8 is smaller than a single crystal diameter of the bulk SiC single crystal 2.

The growing crucible 3 including the crucible lid 7 consists, in the embodiment according to FIG. 1, of an electrically and thermally conductive graphite crucible material with a density of, for example at least 1.75 g/cm$^3$. Around it is arranged a thermal insulation layer 10. The latter consists, for example, of a foam-like graphite insulation material, the porosity of which is, in particular, higher than that of the graphite crucible material.

The thermally insulated growing crucible 3 is placed inside a tubular container 11, which in the embodiment is configured as a quartz glass tube and forms an autoclave or reactor. An inductive heating device in the form of a heating coil 12 is arranged around the container 11 to heat the growing crucible 3. The growing crucible 3 is heated by the heating coil 12 to growth temperatures of more than 2000° C., in particular to about 2200° C. The heating coil 12 inductively couples an electric current into an electrically conductive crucible wall 13 of the growing crucible 3. This electric current flows substantially as a circulating current in the peripheral direction within the circular and hollow cylindrical crucible wall 13 and in the process heat the growing crucible 3. If necessary, the relative position between the heating coil 12 and the growing crucible 3 may be changed axially, i.e. in the direction of a longitudinal mid-axis 14 of the growing bulk SiC single crystal 2, in particular in order to adjust the temperature or the temperature course within the growing crucible 3 and optionally also to change it. The axially changeable position of the heating coil 12 during the growth process is indicated in FIG. 1 by the double arrow 15. In particular, the heating coil 12 is displaced in a manner adapted to the growth progress of the growing bulk SiC single crystal 2. The displacement preferably takes place downward, in other words in the direction of the SiC source material 6, and preferably by the same length by which the bulk SiC single crystal 2 grows, for example in total by about 20 mm. For this purpose, the growth arrangement contains checking, control and adjustment devices configured accordingly and not shown in more detail.

The SiC growth gas phase 9 in the crystal growth region 5 is fed by the SiC source material 6. The SiC growth gas phase 9 contains at least gas constituents in the form of Si, $Si_2C$ and $SiC_2$ (SiC gas species). The transport of the SiC source material 6 to a growth interface 16 on the growing bulk SiC single crystal 2 takes place along an axial temperature gradient. An axial temperature gradient measured in the direction of the longitudinal mid-axis 14 of at least 5 K/cm, preferably of at least 10 K/cm, is adjusted, in particular, at the growth interface 16. The temperature within the growing crucible 3 decreases toward the growing bulk SiC single crystal 2. This can be achieved by various measures. Thus, by means of a division, not shown in more detail, of the heating coil 12 into two or more axial partial portions, an axially varying heating can be provided. Furthermore, a stronger heating effect can be adjusted in the lower portion of the growing crucible 3, for example by a corresponding axial positioning of the heating coil 12, than in the upper portion of the growing crucible 3. Moreover, the thermal insulation at the two axial front end crucible walls may be different. As indicated schematically in FIG. 1, the thermal insulation layer 10 at the lower front end crucible wall may have a larger thickness for this purpose than at the upper front end crucible wall. Furthermore, it is possible for the thermal insulation layer 10 adjacent to the crucible lid 7, which forms the upper front end crucible wall, to have a central cooling opening 17, which is arranged about the longitudinal mid-axis 14 and through which heat is dissipated. This central cooling opening 17 is indicated in FIG. 1 by the dashed lines.

The bulk SiC single crystal 2 grows in a growth direction 18, which, in the embodiment shown in FIG. 1, is oriented from top to bottom, in other words from the crucible lid 7 toward the SiC supply region 4. The growth direction 18 extends parallel to the central longitudinal mid-axis 14. As the growing bulk SiC single crystal 2 in the embodiment shown is arranged concentrically inside the growth arrangement 1, the central longitudinal mid-axis 14 may also be associated, as a whole, with the growth arrangement 1.

Moreover, the SiC growth gas phase 9 in the view according to FIG. 1, also contains dopants, not shown in more detail, which are nitrogen ($N_2$) in the embodiment. Alternative or additional dopants, such as, in particular, aluminum (Al), vanadium (Va) and/or boron (B) are also possible. The dopant feed takes place either gaseously or by the SiC source material 6, which is then correspondingly pretreated. The nitrogen fraction in the SiC growth gas phase 7 is adjusted, in this case, in such a way that the nitrogen doping of the growing bulk SiC single crystal 2 is so large that the growing bulk SiC single crystal 2, at least in the center about the longitudinal mid-axis 14 has a relatively low averaged specific electrical resistance of a maximum of about 20 mΩcm.

Figure 2:
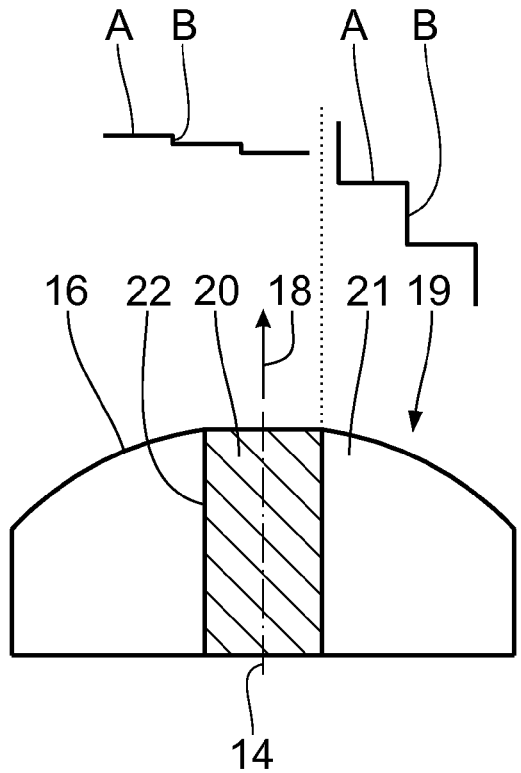
FIG. 2 is a diagrammatic, cross-sectional view of a conventional bulk SiC single crystal.
Figure 3:
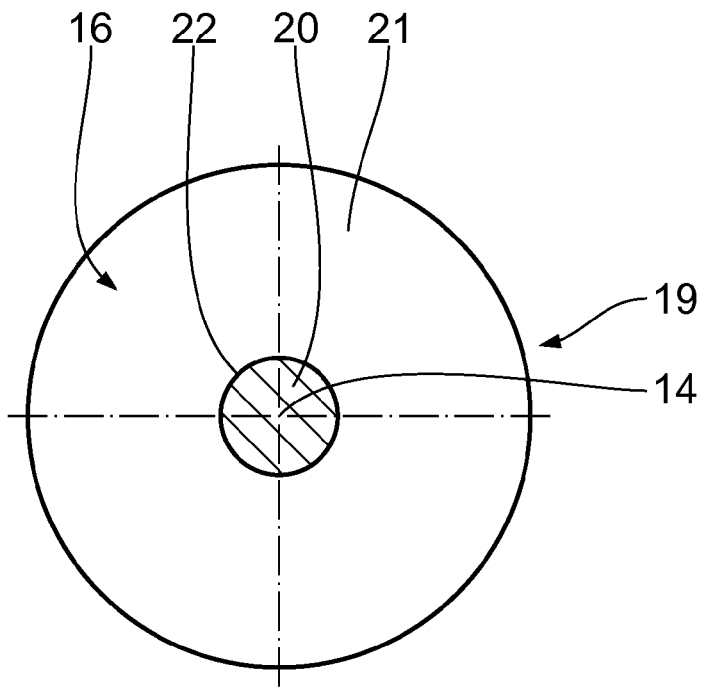
FIG. 3 is a plan view of the conventional bulk SiC single crystal.

FIGS. 2 and 3 show a conventional bulk SiC single crystal 19 in a cross sectional view and in a plan view. The bulk SiC single crystal 19 has a crystal structure according to the 4H modification, the crystallographic [0001] main axis of which in the embodiment shown extends parallel to the growth direction 18 and therefore also to the longitudinal mid-axis 14. The bulk SiC single crystal 19 has three part regions 20 to 22. Arranged about the longitudinal mid-axis 14 is a central facet region 20, which is surrounded by an edge region 21, a transition region 22 being formed between the two part regions 20 and 21.

The facet region 22 has a largely flat and smooth surface structure (surface morphology). The crystal growth stages also drawn schematically in FIG. 2 have a stage height B, which is measured in the growth direction 18, i.e. in the direction and which is very much smaller in the facet region 20 compared with a stage depth A measured perpendicular to the growth direction 18. The quotient N=A/B thus has a very large value here. The stage height B is typically less than 1 μm, whereas the stage depth A is generally about 100 μm.

The edge region 21, on the other hand, has a curved surface structure, which largely corresponds to the typically convex temperature field in front of the growth interface 16. The curved surface structure leads to an approximately balanced ratio of the stage depth A to the stage height B. The quotient N=NB has approximately the value one here. As a result of this, the surface in the edge region 21 is significantly rougher than in the facet region 20. The stage height B and the stage depth A are typically about 1 mm in each case here.

As the incorporation of dopants varies sharply for differently oriented crystal surfaces, and in the facet region 20 the fraction of surfaces, which are oriented perpendicular to the growth direction 18 (i.e. surfaces in the direction of the stage depth A), strongly dominate, there is a significantly higher dopant incorporation into the crystal structure in the facet region 20 than in the edge region 21. Overall, in the bulk SiC single crystal 19, the dopant concentration and therefore also the local specific electrical resistance perpendicular to the growth direction 18 are inhomogeneously distributed. This is unfavorable, as the specific resistance either in the facet region 20 or in the edge region 21 does not correspond to the desired specifications, so the relevant part region cannot be further used or only to a limited extent, for example, for component production. The growth conditions are generally adjusted such that the larger edge region 21 in terms of area has the desired dopant concentration or the desired electrical resistance and can therefore be used further.

The facet region 20 does not absolutely have to be arranged concentrically with respect to the longitudinal mid-axis 14. In particular if the bulk SiC single crystal grows with a slight inclination of, for example, 1° to 10° relative to the crystallographic [0001] main axis, the facet region then being adjusted may also then be placed asymmetrically or acentrically with respect to the longitudinal mid-axis 14. However, this does not change anything about the inhomogeneous distribution of the dopant concentration and the specific electrical resistance.

In order to make better use of the bulk SiC single crystals 2, the central facet region 20 or that close to the center (with growth inclined in relation to the crystallographic main axes) is sharply increased according to the invention and compared with conventional bulk SiC single crystals 19, so it makes up the largest fraction of the growth interface 16 by a long way. At the same time, the growth conditions are adjusted such that the dopant incorporation in the facet region 20 leads to the desired specific electrical resistance there. In order to enlarge the facet region 20, at least in a central main growth region of the growth interface 16 arranged about the longitudinal mid-axis 14, a lateral temperature gradient measured perpendicular to the longitudinal mid-axis 14 of at most 2 K/cm, in particular of at most 1 K/cm, is adjusted and kept in this value range during the entire production period.

Figure 4:
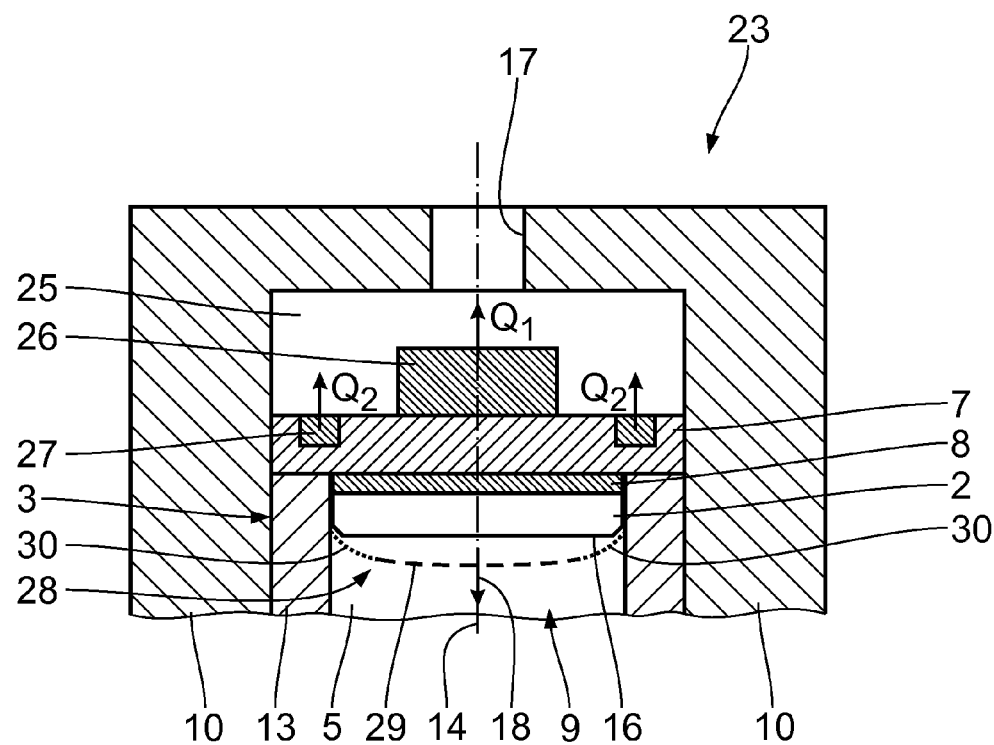
FIGS. 4 and 5 are diagrammatic, cross-sectional views of two further embodiments of growth arrangements for the sublimation growth of a bulk SiC single crystal with additional thermal insulation according to the invention.
Figure 5:
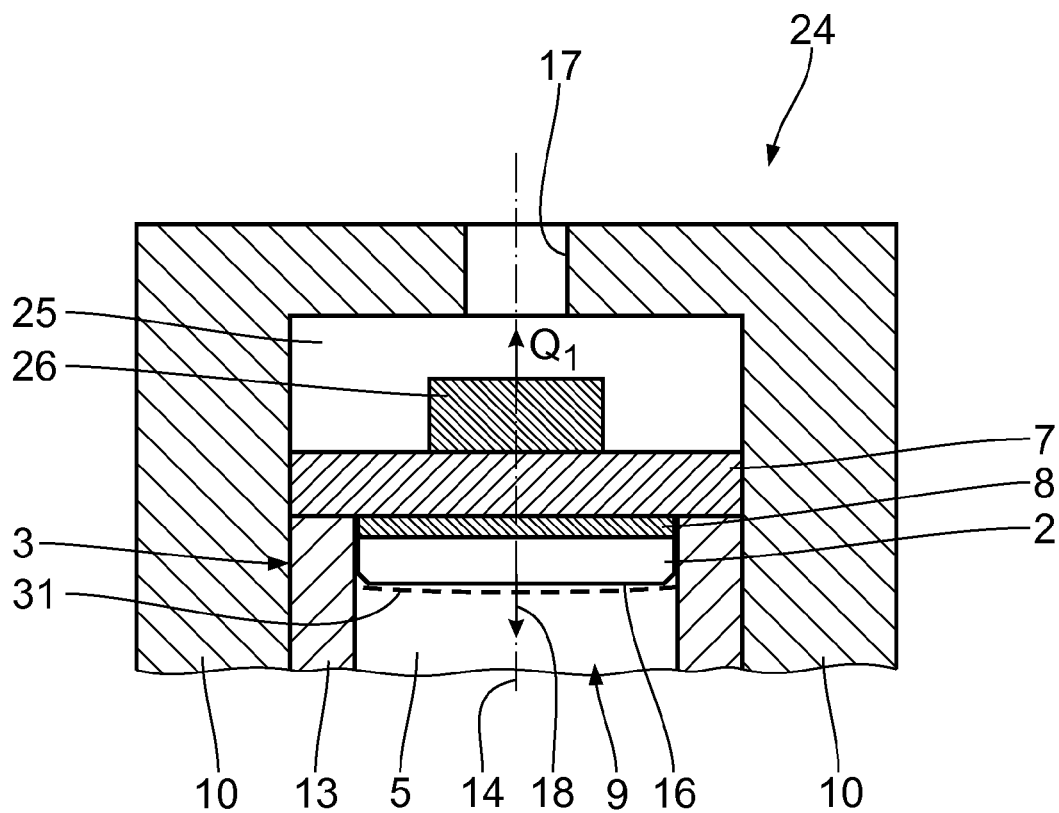

The further embodiments of growth arrangement 23 and 24 shown detail-wise in each case in FIGS. 4 and 5 each contain a modified structure to thus adjust a temperature field with the very low lateral temperature gradient in front of or at the growth interface 16. The parts, not shown in more detail in FIGS. 4 and 5, correspond to those of the growth arrangement 1 according to FIG. 1.

Provided in the growth arrangement 23 according to FIG. 4 between the crucible lid 7 and the thermal insulation layer on the end face is a free space 25, in which a thermal insulation insert 26 is arranged. The latter is placed on the side of the crucible lid 7 remote from the seed crystal. Alternatively, a recess to at least partially receive the thermal insulation insert 26 may also be provided in the crucible lid 7. The thermal insulation insert 26 has a round cross sectional geometry. It is arranged centrally, in particular concentrically about the longitudinal mid-axis 14, and opposing the cooling opening 17. The lateral dimensions measured perpendicular to the central longitudinal mid-axis 14, in other words diameters, of the thermal insulation insert 26 and a cooling opening 17 differ from one another by at most 50%. For example, the two diameters differ by a maximum of 5 mm from one another. In the direction perpendicular thereto, in other words in the direction of the central longitudinal mid-axis 14, the thermal insulation insert 26 with its lower limiting face is located at a spacing of at most 5 mm from the upper limiting face of the seed crystal 8.

Moreover, a further thermal insulation insert 27 is provided, which is, in particular, annular or cylindrical and is preferably also arranged concentrically about a central longitudinal axis 14. It is located in a recess which is provided on the side of the crucible lid 7 remote from the seed crystal 8 and circulates close to the peripheral edge of the crucible lid 7. Alternatively, the peripheral thermal insulation insert 27 may, however, also be placed, similarly to the central thermal insulation insert 26, on the side of the crucible lid 7 remote from the seed crystal 8 on the crucible lid 7. The annular thermal insulation insert 27 is dimensioned and placed such that its internal diameter and its external diameter are in each case spaced apart by at most 10 mm from a lateral edge of the growing bulk SiC single crystal 2 (peripheral crystal edge) projected into the plane of the thermal insulation insert 27. In particular, the annular thermal insulation insert 27 is arranged approximately centrally or symmetrically in relation to the bulk SiC single crystal 2, i.e. the inner and the outer peripheral edge of the thermal insulation insert 27 are spaced approximately at the same distance from the peripheral crystal edge projected into the plane of the thermal insulation insert 27. In the axial direction, the thermal insulation insert 27, similarly to the thermal insulation insert 25 with its lower limiting face, is arranged at a spacing of at most 5 mm from the upper limiting face of the seed crystal 8.

The two thermal insulation inserts 26 and 27 in each case consist of an insulation material, which has a heat conductivity of at most 50% of that of the graphite crucible material used for the growing crucible 3 including the crucible lid 7. In particular, this insulation material is graphite with a porosity of at least 10% or a material made of graphite fibers with a porosity of at least 50%. The thermal insulation inserts 26 and 27 reduce the heat dissipation via the cooling opening 17. In this case, the heat insulation inserts 26 and 27 locally influence the heat dissipation from the growth interface 16 in a targeted manner.

The central thermal insulation insert 26 means that at the growth interface 16 in the central region about the longitudinal mid-axis 14, with otherwise the same conditions, because of a reduced heat outflow $Q_1$, a higher local temperature is adjusted than in a conventional growth arrangement. As a result, the lateral isotherm line 28 in this region being adjusted in front of the growth interface 16 and also entered in FIG. 4, is flattened. The very low lateral temperature gradient of at most 2 K/cm is thus produced in a central main growth region 29 of the growth interface 16. The main growth region 29 arranged about the longitudinal mid-axis 14 contains at least two thirds of the entire growth interface 16 and is indicated in FIG. 4 by the dashed line guidance of the isotherm line 28.

The peripheral thermal insulation insert 27 means that a higher local temperature is adjusted at the growth interface 16 in the peripheral edge region in the event of otherwise identical conditions because of a reduced heat outflow $Q_2$ than in a conventional growth arrangement. As a result, a locally increased crystal growth rate is compensated, which would otherwise be adjusted here because of a local carbon excess in the SiC growth gas phase 9. The local carbon excess in the edge region of the SiC growth gas phase 9 is caused by an escape of carbon from the crucible wall 13 consisting of graphite. Because of the peripheral thermal insulation insert 27, a comparatively high temperature and also a relatively high lateral temperature gradient of more than 2 K/cm, preferably of at least 10 K/cm are adjusted in an edge growth region 30 of the growth interface 16. This also emerges from the course of the isotherm line 28, which is drawn by dotted lines in the portions relating to the edge growth region 30. The edge growth region 30 contains at most a third of the total growth interface 16.

The growth arrangement 24 according to FIG. 5 differs from the growth arrangement 23 in that a different and, in particular, carbon-free crucible material, for example tantalum (Ta), is used, on the one hand, for the growing crucible 3, at least on a crucible inside adjoining the crystal growth region 5. In the embodiment shown, the growing crucible 3 consists completely of tantalum. On the other hand, the peripheral thermal insulation insert 27 is not present.

As no additional carbon arrives in the SiC growth gas phase 9 from the crucible wall 13 consisting of tantalum in this example, there is no carbon excess in the edge region and therefore also no tendency to a higher local growth rate. Consequently, no peripheral thermal insulation insert 27 is required here in order to adjust a higher temperature counteracting a local growth acceleration. Instead, a lower lateral temperature gradient of at most 2 K/cm is adjusted at the entire growth interface 16. The resulting flat and/or at most very slightly curved temperature field is illustrated by the lateral thermal line 31 also entered in FIG. 5.

Figure 6:
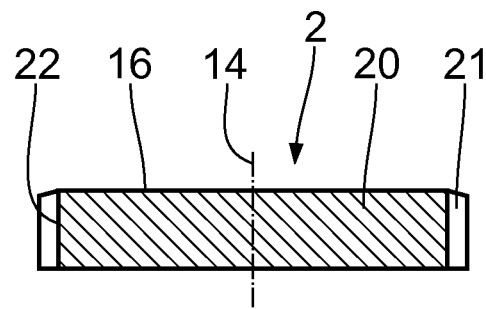
FIG. 6 is a diagrammatic, cross-sectional view of an embodiment of a bulk SiC single crystal produced by one of the growth arrangements according to FIGS. 4 and 5.
Figure 7:
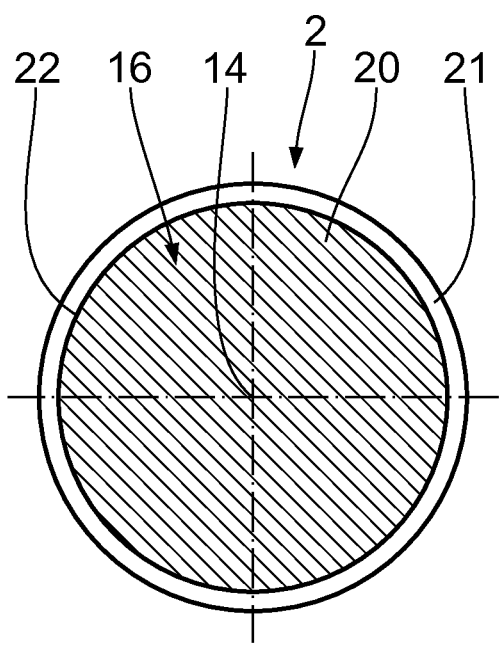
FIG. 7 is a diagrammatic, plan view of the embodiment of the bulk SiC single crystal produced by one of the growth arrangements according to FIGS. 4 and 5.

FIGS. 6 and 7 show a bulk SiC single crystal 2 produced according to the invention in a cross sectional view or in a plan view. Its facet region 20 compared with the conventionally produced bulk SiC single crystal 19 shown in FIGS. 2 and 3, is significantly larger. In particular, the facet diameter is at least 90% of the external diameter of the bulk SiC single crystal 2. Within this sharply increased facet region 20 there is a very homogeneous distribution of the dopant concentration and therefore of the electrical resistance. In the embodiment, the bulk SiC single crystal 2 has an n-doping with nitrogen. Moreover, this is 4H—SiC. However, basically a different doping or another SiC polytype is possible.

Figure 8:
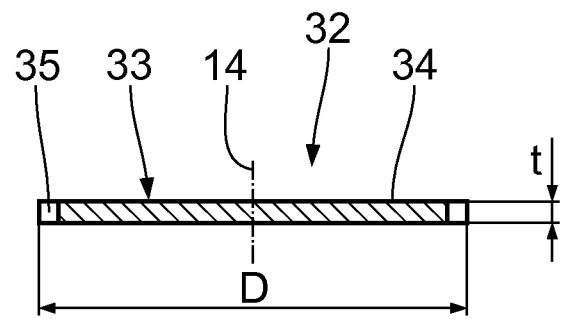
FIG. 8 is a diagrammatic, cross-sectional view of an embodiment of a monocrystalline SiC substrate, which is produced from a bulk SiC single crystal grown by one of the growth arrangements according to FIGS. 4 and 5.

Monocrystalline SiC substrates 32, which have very favorable mechanical and electrical properties, can be produced from a bulk SiC single crystal 2 produced according to the invention. All the monocrystalline SiC substrates 32 of this type, of which an embodiment is shown in FIG. 8 in a cross sectional view, are obtained from the bulk SiC single crystal 2 in that they are cut off or sawn off axially successively as discs perpendicular to the growth direction 18 or to the longitudinal mid-axis 14. The SiC substrate 32 is large and thin. In the embodiment, its main substrate surface 33 has a large substrate diameter D of 150 mm, whereas a substrate thickness t is at the low value of only about 500 µm.

Moreover, the SiC substrate 32, just like the bulk SiC single crystal 2, has, at least in a central main substrate surface region 34, a very homogeneously distributed specific resistance, the mean value of which determined in relation to the main substrate surface region 34 and to the substrate thickness t is about 16 mΩcm in this region. Within this main substrate surface region 34 it applies that a local specific electrical resistance determined for any part surface which is 4 mm² in size and in relation to the substrate thickness t differs by at most 1 mΩcm from the mean specific electrical resistance. The resistance distribution is thus extremely homogeneous. The SiC substrate in the embodiment is also, like the bulk SiC single crystal 2, n-doped and of the 4H polytype.

The main substrate surface region 34 contains at least 90% of the total main substrate surface 33 and has substantially the same lateral extent as the facet region 20 described in connection with the growth of the bulk SiC single crystal 2. It is, in particular, surrounded symmetrically or concentrically by an edge exclusion region 35, the surface fraction of which is at most 10% in relation to the entire main substrate surface 33. The main substrate surface region 34 and the edge exclusion region 35 may, but do not necessarily have to be, arranged concentrically with respect to the longitudinal mid-axis 14.

As only the main substrate surface region 34 is processed further for the component production, it is favorable if the main substrate surface region 34 covers at most a cross sectional surface fraction of the same size of the bulk SiC single crystal 2 as the facet region 20. It is thus ensured that only a substrate surface with a very uniform specific electrical resistance is used for the component production.

The invention claimed is:

1. A monocrystalline SiC substrate, comprising:
a substrate structure having a main substrate surface with a main substrate surface region, a substrate thickness, and a mean specific electrical resistance which is determined based on said main substrate surface region, which is at least 90% in size of said main substrate surface, and on said substrate thickness, wherein it applies to said main substrate surface region that a local specific electrical resistance determined for any part surface which is 4 mm² in size of said main substrate surface region and based on said substrate thickness differs by at most 1 mΩcm from the mean specific electrical resistance;
said main substrate surface having an edge exclusion region being at most 10% in size of said main substrate surface and surrounding said main substrate surface region;
said main substrate surface region being a facet region, a jump of an electrical resistance being provided at a transition from said facet region to said edge exclusion region, said facet region, with an optical transillumination of the monocrystalline SiC substrate, being distinguished by a darker (color) impression relative to said edge exclusion region; and
said edge exclusion region having a mean specific electrical edge resistance being higher than a mean specific electrical resistance of said main substrate surface region.

2. The monocrystalline SiC substrate according to claim 1, wherein a part surface of said main substrate surface region is square.

3. The SiC substrate according to claim 1, wherein said main substrate surface has an edge exclusion region, which is at most 10% in size, which surrounds said main substrate surface region one of symmetrically and concentrically.

4. The SiC substrate according to claim 1, wherein said main substrate surface has a diameter of at least 100 mm.

5. The SiC substrate according to claim 1, wherein said main substrate surface has a diameter of at least 150 mm.

6. The SiC substrate according to claim 1, wherein said main substrate surface has a diameter of at least 200 mm.

7. The SiC substrate according to claim 1, wherein said main substrate surface has a diameter of at least 250 mm.

\* \* \* \* \*